US006962871B2

(12) United States Patent
Lee et al.

(10) Patent No.: US 6,962,871 B2
(45) Date of Patent: Nov. 8, 2005

(54) COMPOSITE POLYMER DIELECTRIC FILM

(75) Inventors: Chung J. Lee, Fremont, CA (US); Atul Kumar, Santa Clara, CA (US)

(73) Assignee: Dielectric Systems, Inc., Fremont, CA (US)

( * ) Notice: Subject to any disclaimer, the term of this patent is extended or adjusted under 35 U.S.C. 154(b) by 0 days.

(21) Appl. No.: 10/816,205

(22) Filed: Mar. 31, 2004

(65) Prior Publication Data

US 2005/0218481 A1    Oct. 6, 2005

(51) Int. Cl.⁷ .......................................... H01L 21/4763
(52) U.S. Cl. ..................................... 438/624; 438/628
(58) Field of Search ......... 436/624–629; 438/624–629

(56) References Cited

U.S. PATENT DOCUMENTS

| 3,268,599 | A | 8/1966  | Chow          |
| 3,274,267 | A | 9/1966  | Chow          |
| 3,280,202 | A | 10/1966 | Gilch         |
| 3,288,728 | A | 11/1966 | Gorham        |
| 3,332,891 | A | 7/1967  | Chow et al.   |
| 3,342,754 | A | 9/1967  | Gorham et al. |
| 3,349,045 | A | 10/1967 | Gilch         |
| 3,379,803 | A | 4/1968  | Tittmann et al. |
| 3,503,903 | A | 3/1970  | Shaw et al.   |
| 3,509,075 | A | 4/1970  | Niegish et al. |
| 3,626,032 | A | 12/1971 | Norris        |
| 3,694,495 | A | 9/1972  | Norris        |
| 3,940,530 | A | 2/1976  | Loeb et al.   |
| 4,117,308 | A | 9/1978  | Boggs et al.  |
| 4,518,623 | A | 5/1985  | Riley         |
| 4,823,711 | A | 4/1989  | Kroneberger et al. |
| 4,996,010 | A | 2/1991  | Modrek        |
| 5,142,023 | A | 8/1992  | Gruber et al. |
| 5,217,559 | A | 6/1993  | Moslehi et al. |
| 5,268,202 | A | 12/1993 | You et al.    |
| 5,320,518 | A | 6/1994  | Stilger et al. |
| 5,475,080 | A | 12/1995 | Gruber et al. |
| 5,482,009 | A | 1/1996  | Kobayashi et al. |
| 5,538,758 | A | 7/1996  | Beach et al.  |
| 5,572,884 | A | 11/1996 | Christensen et al. |
| 5,639,512 | A | 6/1997  | Nonaka et al. |
| 5,648,006 | A | 7/1997  | Min et al.    |
| 5,879,808 | A | 3/1999  | Wary et al.   |

(Continued)

FOREIGN PATENT DOCUMENTS

EP          0 349 032 A2       1/1990

(Continued)

OTHER PUBLICATIONS

*Parylene Copolymres*, Taylor et al., *Low Dielectric Constant Materials III*, pp. 197-205, 1997.

(Continued)

*Primary Examiner*—Cuong Nguyen
(74) *Attorney, Agent, or Firm*—Alleman Hall McCoy Russell & Tuttle LLP (57) ABSTRACT

An integrated circuit including a composite polymer dielectric layer formed on a substrate is disclosed, wherein the composite polymer dielectric layer includes a first silane-containing layer formed on the substrate, wherein the first silane-containing layer is formed at least partially from an organosilane material, a polymer dielectric layer formed on the first silane-containing layer, and a second silane-containing layer formed on the polymer dielectric layer. In some embodiments, the first silane-containing layer and second silane-containing layer may be formed from organosilane materials having at least one unsaturated bond capable of free radical polymerization. Systems and methods for making the disclosed integrated circuits are also provided.

43 Claims, 7 Drawing Sheets

U.S. PATENT DOCUMENTS

| | | | |
|---|---|---|---|
| 5,945,170 A | 8/1999 | Kozak et al. | |
| 5,958,510 A | 9/1999 | Sivaramakrisham | |
| 6,051,321 A | 4/2000 | Lee et al. | |
| 6,086,952 A | 7/2000 | Lang et al. | |
| 6,130,171 A | 10/2000 | Gomi | |
| 6,140,456 A | 10/2000 | Foggiator et al. | |
| 6,144,802 A | 11/2000 | Kim | |
| 6,265,320 B1 | 7/2001 | Shi et al. | |
| 6,302,874 B1 | 10/2001 | Zhang | |
| 6,362,091 B1 * | 3/2002 | Andideh et al. | 438/624 |
| 6,455,443 B1 | 9/2002 | Eckert et al. | |
| 6,495,208 B1 | 12/2002 | Desu et al. | |
| 6,703,462 B2 | 3/2004 | Lee | |
| 6,797,343 B2 | 9/2004 | Lee | |
| 2002/0050659 A1 | 5/2002 | Toreki et al. | |
| 2002/0120083 A1 | 8/2002 | Lee | |
| 2003/0051662 A1 | 3/2003 | Lee | |
| 2003/0072947 A1 | 4/2003 | Lee | |
| 2003/0143341 A1 | 7/2003 | Lee | |
| 2003/0188683 A1 | 10/2003 | Lee | |
| 2003/0195312 A1 | 10/2003 | Lee | |
| 2003/0196680 A1 | 10/2003 | Lee | |
| 2003/0198578 A1 | 10/2003 | Lee | |

FOREIGN PATENT DOCUMENTS

| | | |
|---|---|---|
| EP | 0 523 479 A2 | 1/1993 |
| EP | 0 856 503 A1 | 8/1998 |
| GB | 650 947 | 3/1951 |
| GB | 673 651 | 6/1952 |
| WO | WO 97/15699 | 5/1997 |
| WO | WO 97/15951 | 5/1997 |
| WO | WO 97/42356 | 11/1997 |
| WO | WO 99/21705 | 5/1999 |
| WO | WO 99/21706 | 5/1999 |
| WO | WO 99/21924 | 5/1999 |
| WO | WO 99/22043 | 5/1999 |

OTHER PUBLICATIONS

Finer Copper Wires Make for Faster Integrated Circuits, Preuss, Research News, pp. 1-3, Apr. 5, 1999.

Study of Hydrogen Annealing of Ultrahigh Molecular Weight Polyethylene Irradiated with High-Energy Protons, Wilson et al., Journal of Materials Research, vol. 14, No. 11, Nov. 1999.

A Novel Oxazole Based Low k Dielectric Addresses Copper Damascene Needs, Schmid et al., Semiconductor Fabtech, 12th Edition, pp. 231-235, Jul. 2000.

The Effect of Water Desorption and Organosilane Coupling Agents on the Adhesion of Poly(p-xylylene) Films to a Silicon Wafer Surface, Lightfoot et a l., Journal of Materials Science: Materials in Electronics, vol. 12, pp. 581-586, 2001.

Current Technical Trends: Dual Damascene & Low-k Dielectrics, Healey on behalf of Threshold Systems, pp. 1-6, © 2002.

Chow et al., Poly (a,a,a',a'-tetrafluoro-p-xylylene), Journal of Applied Polymer Science, vol. 13, No. 9, pp. 2325-2332, 1969.

Chow et al., The Synthesis of 1,1,2,2,9,9,10,10-octafluorou2, 2Paracyclophane, Journal of Organic Chemistry, vol. 35, No. 1, pp. 20-22, 1970.

Iwamoto et al., Crystal Structure of Poly-p-xylylene. 1. The a Form, Jour. Polymer. Sci.Polymer. Phys. Ed., vol. 11, pp. 2403-2411, 1973.

Iwamoto et al., Crystallization During Polymerization of Poly-p-xylene. III. Crystal Structure and Molecular Orientation as a Function of Temperature, Journal of Polymer Science Polymer. Phys. Ed., vol. 13, pp. 1925-1938, 1975.

Lee, Transport Polymerization of Gaseous Intermediates and Polymer Crystal Growth, J. Macromol. Sci. Rev. Macromol. Chem., C16(1), p. 79-127, 1977-78.

Sharma et al., Optimizing Poly(chloro-p-Xylelene) or Parylene C Synthesis, Journal of Applied Science, vol. 36, No. 7, pp. 1555-1565, Sep. 20, 1988.

Lee, Polyimides, Polyquinolines and Polyquinoxalines: Tg-Structure Relationships, Journal of Macromolecular Science, Part C-Polymer Reviews (formerly Journal of Macromolecular Science, Part C- Reviews in Macromolecular Chemistry and Physics) vol. 29(4), p. 431, 1989.

Lang, Vapor Deposition of Very low k Polymer Films, Poly (Naphthalene), Poly (Fluorinated Naphthalene), Materials Research Society Symposium Proceedings, vol. 381, pp. 45-50, Apr. 17, 1995.

Wary et al., Polymer Developed to be Interlayer Dielectric, Semi-Conductor International, pp. 211-216, Jun. 1996.

Wunderlick, Crystal Nucleation, Growth, Annealing, Macromolecular Physics, vol. 1-2, pp. 242-243, 246-247, 1996.

Greiner, Poly(1,4-xylylene)s: Polymer Films by Chemical Vapour Deposition, Trends in Polymer Science, vol. 5, No. 1, pp. 12-16, 1997.

Harrus et al., Parylene Af-4: A Low $e_R$ Material Candidate for ULSI Multilevel Interconnect Applications, Material Research Society Symposium Proceedings, vol. 443, 1997.

Plano et al., The Effect of Deposition Conditions on the Properties of Vapor-Deposited Parylene Af-4 Films, Material Research Society Symposium Proceedings, vol. 476, pp. 213-218, 1997.

Ryan et al., Effect of Deposition and Annealing on the Thermomechanical Properties of Parylene Films, Material Research Society Symposium Proceedings, vol. 476, pp. 225-230, 1997.

Yang et al., High Deposition Rate Parylene Films, Journal of Crystal Growth, vol. 183, No. 3, pp. 385-390, 1998.

Mathur et al., Vapor Deposition of Parylene-F Using Hydrogen as Carrier Gas, Journal of Materials Research, vol. 14, No. 1, pp. 246-250, 1999.

Morgen et al., Morphological Transitions in Fluorinated and Non-Fluorinated Parylenes, Material Research Society Symposium Proceedings, vol. 565, pp. 297-302, 1999.

Brun, 100nm: The Undiscovered Country, Semiconductor International, p. 79, Feb. 2000.

Peng and McGivern, Quantum Yields and Energy Partitioning in the UV Photodissociation of Halon 2402, Journal of Chemical Physics, vol. 113, No. 17, pp. 7149-7157, 2000.

Rashed, Properties and Characteristics of Silicon Carbide, website publication (www.poco.com), POCO Graphite Inc., 2002.

* cited by examiner

COMPOSITE POLYMER DIELECTRIC FILM

CROSS-REFERENCE TO RELATED APPLICATIONS

This application is related to U.S. patent application Ser. No. 10/815,994, filed Mar. 31, 2004, entitled Single and Dual Damascene Techniques Utilizing Composite Polymer Dielectric Film, by inventors Chung J. Lee and Atul Kumar, and also is related to U.S. patent application Ser. No. 10/816,179, filed Mar. 31, 2004, entitled System for Forming Composite Polymer Dielectric Film, by inventors Chung J. Lee, Atul Kumar, Chieh Chen, and Yuri Pikovsky.

BACKGROUND

Integrated circuits contain many different layers of materials, including dielectric layers that insulate adjacent conducting layers from one another. With each decrease in the size of integrated circuits, the individual conducting layers within the integrated circuits grow closer to adjacent conducting layers. This necessitates the use of dielectric layers made of materials with low dielectric constants to prevent problems with capacitance, cross talk, etc. between adjacent conducting layers.

Low dielectric constant polymers have shown promise for use as dielectric materials in integrated circuits. Examples of low dielectric constant polymers include, but are not limited to, fluoropolymers such as TEFLON (($-CF_2-CF_2-$)$_n$; $k_d=1.9$) and PPX-F (($-CF_2-C_6H_4-CF_2-$)$_n$; $k_d$2.23). Many of these materials have been found to be dimensionally and chemically stable under temperatures and processing conditions used in later fabrication steps, have low moisture absorption characteristics, and also have other favorable physical properties.

However, many low dielectric constant polymers have been found to adhere poorly to silicon-containing layers that are commonly used in integrated circuits, including but not limited to silicon oxide, silicon nitride, silicon carbide, and $SiO_xC_yH_z$. Furthermore, the syntheses used to create these films may leave many unreacted free radical chain ends, which may be susceptible to contamination by water, oxygen, and other materials that may reduce the dimensional and chemical stability of the film under increased temperatures. These problems may result in unreliable device fabrication and low device yields.

SUMMARY

An integrated circuit including a composite polymer dielectric layer formed on a substrate is provided, wherein the composite polymer dielectric layer includes a first silane-containing layer formed on the substrate, wherein the first silane-containing layer is formed at least partially from an organosilane material, a polymer dielectric layer formed on the first silane-containing layer, and a second silane-containing layer formed on the polymer dielectric layer. In some embodiments, the first silane-containing layer and second silane-containing layer may be formed from organosilane materials having at least one unsaturated bond capable of free radical polymerization. Systems and methods for making the disclosed integrated circuits are also provided.

DETAILED DESCRIPTION OF THE DEPICTED EMBODIMENTS

Figure 1:
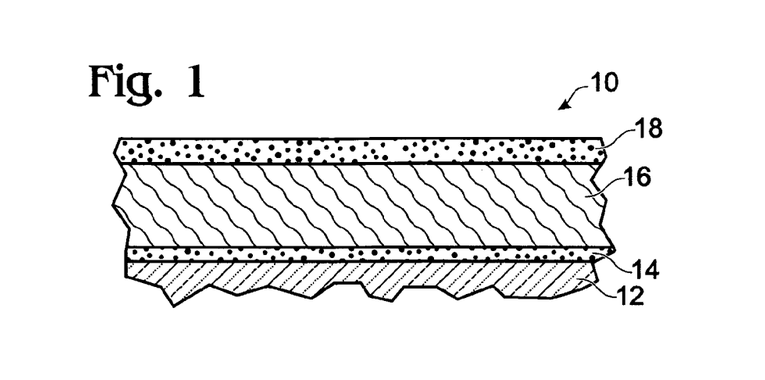
FIG. 1 is a greatly magnified sectional view of an embodiment of a composite polymer dielectric film, formed on an underlying substrate.

FIG. 1 shows, generally at 10, a first exemplary embodiment of a composite polymer dielectric film formed on a substrate 12. Composite polymer dielectric film 10 includes a first silane-containing adhesion promoter layer 14 disposed on substrate 12, a low dielectric constant polymer layer 16 disposed on first adhesion promoter layer 14, and a second silane-containing layer 18 disposed on low dielectric constant polymer layer 16. Composite polymer dielectric film 10 is typically used as an interlayer in an integrated circuit. Thus, other layers (not shown for purposes of clarity) are typically formed over second silane-containing layer 18. While layer 18 is described in some of the depicted embodiments as being a second adhesion promoter layer, it will be appreciated that layer 18 also may be a hard mask layer or an etch stop layer, such as those used in single and dual damascene processes. Each of these variations is described in more detail below.

As described above, low dielectric constant polymer layer 16 may be formed from materials such as TEFLON, PPX-F and other similar materials. While possessing a low dielectric constant, these materials may not adhere to underlying layers with enough force to withstand the rigors of downstream processing steps. For example, when deposited directly on a layer of silicon oxide or silicon carbide (which are commonly used in integrated circuits), PPX-F adheres to the layer with a yield strength of approximately 2–3 MPa, indicating that the adhesion of the PPX-F film to the silicon oxide or carbide layer is primarily due to Van der Waals interactions. PPX-F may adhere to other silicon-containing layers with similar yield strengths. In contrast, a film should adhere to an underlying or overlying layer with a yield strength of approximately 4–5 MPa for the structure to safely withstand subsequent back-end processing steps. The use of a properly selected adhesion promoter layer 14 may help to increase the yield strength of the low dielectric constant polymer layer 16 on an underlying or overlying silicon-containing layer sufficiently to equal or surpass a desired yield strength threshold without raising the dielectric constant of the overall composite polymer dielectric film 10 an undesirable amount.

First adhesion promoter layer 14 is formed from a material capable of forming chemical bonds to both substrate 12 and low dielectric constant polymer layer 16. One example of a suitable class of materials to use to form first adhesion promoter layer 14 are silanes having a general structure of wherein W is selected from the group consisting of —O—, —CH$_2$—, —(CH$_2$)$_a$C=OO—, and —(CH$_2$)$_a$—OO=C—; wherein T is selected from the group consisting of —CR=CR'R", an alkyl halide, and —RC=O; wherein Z is selected from the group consisting of O and NR; wherein R, R' and R" are an H, alkyl or aromatic group; wherein a is 0 or an integer; wherein x=1, 2 or 3; wherein y=1, 2 or 3; and wherein x+y=4. Alternatively, ZR can be H. Such materials are capable of forming strong Si—Z—Si chemical bonds (Z=O or NR, wherein R is an alkyl or aromatic group) to an underlying silicon-containing substrate.

A more specific example of compounds of the general formula (I) include vinyl compounds having the general formula wherein W may be selected from —O— (such as a vinyl ether)—CH$_2$—, —(CH$_2$)$_a$COO— (such as a vinylacetyl-) and —(CH$_2$)$_a$OOC— (such as a vinylacrylo-), wherein Z is selected from the group consisting of O and NR, wherein R is an alkyl or aromatic group, wherein a is zero or an integer, wherein x=1, 2 or 3, wherein y=1, 2 or 3, and wherein x+y=4. The vinyl group of these compounds is able to undergo a free radical polymerization with vinyl groups on adjacent vinyl silane molecules, thus helping to form a robust, polymerized adhesion layer that is chemically bonded to the adjacent silicon-containing layer. Where y=1 in structure (II) above, a linear vinyl polymer with side silane groups bonded to the underlying silicon layer is produced. Where y=2 or 3, a cross-linked vinyl polymer is produced.

Another specific example of a suitable class of materials of general formula (I) for forming adhesion promoter layer 14 are keto-containing silanes ("Keto silanes") having a general structure of wherein R is an alky group, wherein W is CH$_2$ or (CH$_2$)$_a$, and wherein a is an integer from 1 to 5.

Yet another example of a suitable class of materials of general formula (I) to use to form adhesion promoter layer 14 are halide-containing silanes ("Halide-silanes") having a general structure of wherein X is a halide, typically Cl, Br or I.

All the above-mentioned vinyl, keto and halide silanes can undergo free radical polymerization when initiated by a suitable energy source, such as UV radiation. For example, under UV irradiation, the following reactions can happen:

(A)

(B)
 and (C)

Furthermore, some free radicals in first adhesion promoter layer 14 may not react with other silane molecules, and instead may undergo a free radical reaction with low dielectric constant polymer layer 16. Synthesis of low dielectric constant polymer layer 16 (described in more detail below) may be carried out by transport polymerization of a gas phase diradical monomer species that is able to polymerize upon condensing on a substrate surface from the gas phase. During transport polymerization, some diradical monomers may react with unreacted vinyl silane-, keto silane- or halide silane-derived free radicals in first adhesion promotion layer 14, thus chemically bonding first adhesion promoter layer 14 with low dielectric constant polymer layer 16. Thus, by chemically bonding to both substrate 12 and low dielectric constant polymer layer 16, adhesion promoter layer 14 greatly improves the adhesion of the low dielectric constant polymer layer to the substrate.

FIGS. 2a–2f illustrate an exemplary series of chemical reactions between the acrylosilane (C$_2$H$_5$O)$_3$Si(CH$_2$)$_x$OOC—CH=CH$_2$, an underlying silicon-containing substrate, and an overlying low dielectric constant layer of PPX-F formed from the deposition of the *CF$_2$C$_6$H$_4$CF$_2$* diradical monomer. First referring to FIG. 2a, the silane functional group of the silane molecule may react with surface oxygen typically found on the surface of a silicon-containing substrate via an elimination of an OCH$_2$CH$_3$ leaving group. Here, the surface oxygen in the silicon-containing substrate is shown as being bonded to a hydrogen atom. This bond may be a hydrogen bond, and the hydrogen atom may be part of a water molecule, or the OH may be a hydroxyl group bonded to substrate 12. In either case, the reaction of the silane group with the surface oxygen results in the formation of a chemical bond between the surface oxygen and silicon atom of the silane group, and the production of ethanol from the ethoxide leaving group. In the depicted embodiment, the formation of a single Si—O—Si bond is shown. However, it will be appreciated that more than one Si—O—Si (or, more generally, a Si—Z—Si) bond may form, potentially up to the number of (RZ) leaving groups on the silicon atom in the silane.

Figure 2A:
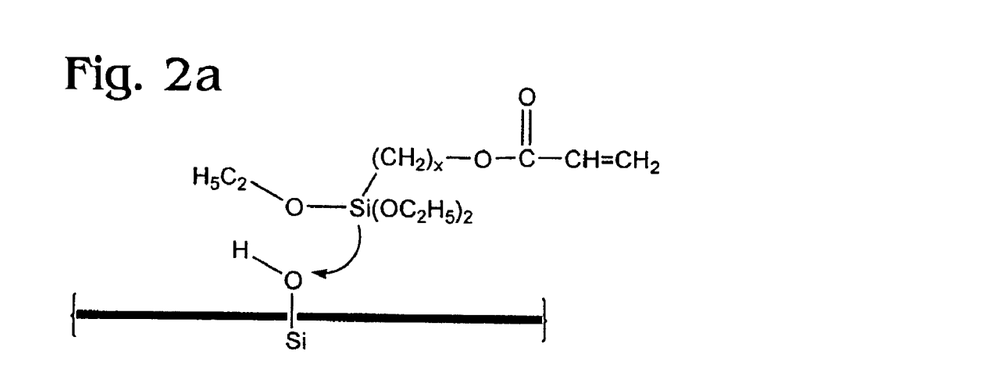
FIGS. 2a–2f show chemical reactions that may occur between the underlying substrate and adhesion promoter layer, within the adhesion promoter layer, and between the adhesion promoter layer and polymer dielectric layer of the embodiment of FIG. 1.
Figure 2B:
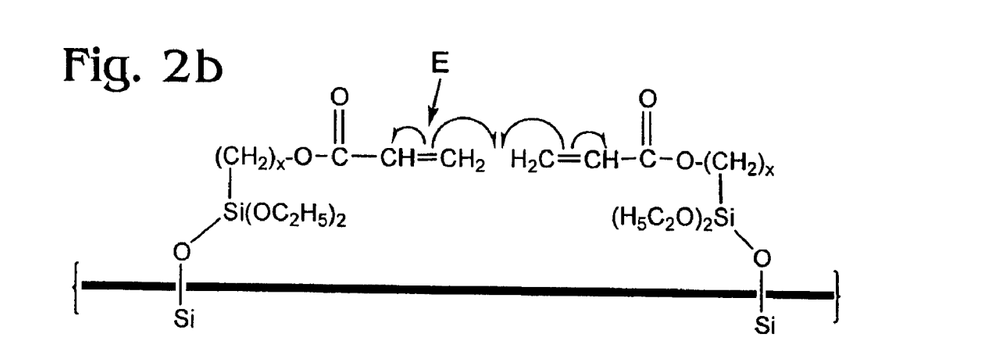
Figure 2C:
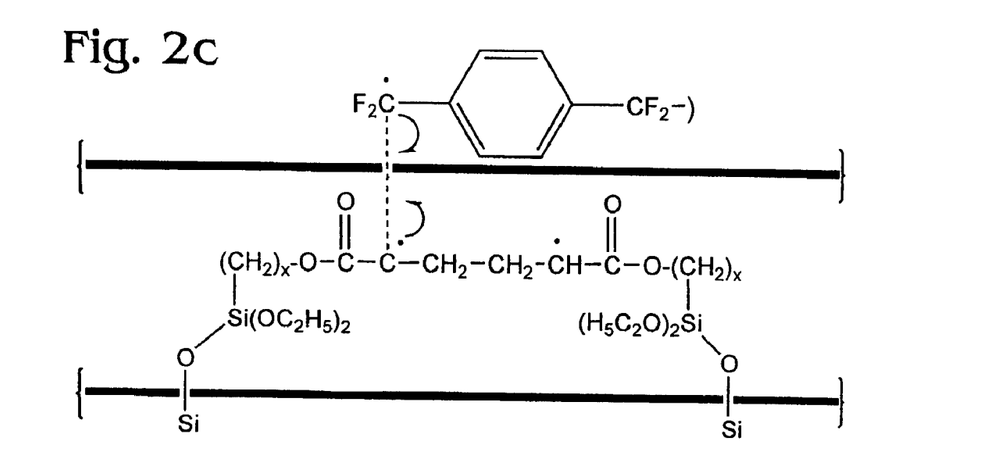
Figure 2D:
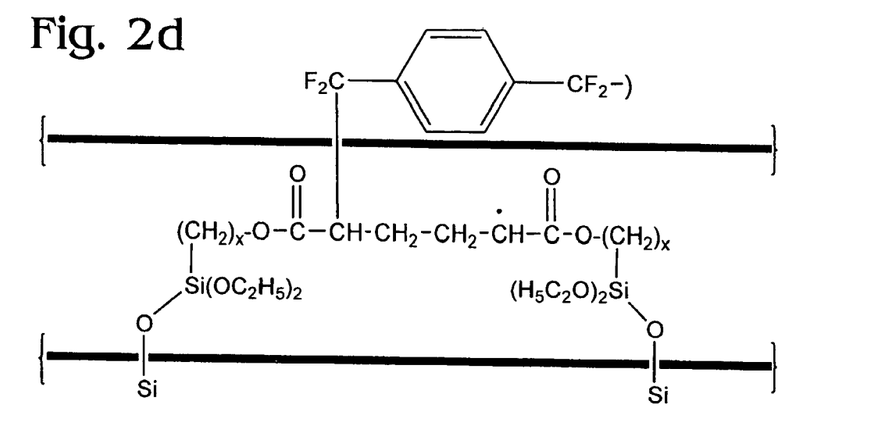

Once the silane has been deposited on substrate 12, the silane layer may be exposed to a suitable energy source, including but not limited to heat, UV light or a plasma, to generate free radicals on the silane molecules. This permits the silane molecules to polymerize to form adhesion promoter layer 14, as depicted in FIG. 2b. Furthermore, as depicted in FIG. 2c, some free radicals in adhesion promoter layer 14 may react with free radicals in low dielectric constant polymer layer 16 during deposition of the low dielectric constant polymer layer, thus chemically bonding first adhesion promoter layer 14 to low dielectric constant polymer layer 16, as shown in FIG. 2d.

After completing the deposition of low dielectric constant polymer layer 16, second adhesion promoter layer 18 may be deposited onto the low dielectric constant polymer layer and exposed to a suitable energy source to generate free radicals from silane molecules in the second adhesion promoter layer (not shown in FIGS. 2a–2f) in the same manner as shown for first adhesion promoter layer 14. This permits the silane molecules in the second adhesion promoter layer to polymerize, thus forming a strong polymer layer. Furthermore, this permits some radicals in second adhesion promoter layer 18 to react with unreacted free radicals in low dielectric constant polymer layer 16 to bond the second adhesion promoter layer to the low dielectric constant polymer layer with strong covalent bonds. The result is that the layers of composite dielectric film 10 are chemically bonded together, and that the surfaces of the composite dielectric film include many pending silane groups capable of forming strong chemical bonds to adjacent silicon-containing (or other) layers.

In some embodiments, composite polymer dielectric film 10 may be annealed after formation. Examples of suitable annealing processes are described in more detail below. Annealing composite polymer dielectric film 10 may help to improve the crystallinity and phase stability of the low dielectric constant polymer layer, as described in U.S. Published Patent Application Serial No. U.S. 2003/0036617 to Chung Lee, filed Aug. 9, 2001, the disclosure of which is hereby incorporated by reference. Furthermore, composite polymer dielectric film 10 may be annealed in the presence of hydrogen gas to cap any unreacted free radicals within the adhesion promoter and low dielectric constant polymer layers with hydrogen atoms, thus helping to prevent unwanted reactions with water, oxygen or other free radical scavengers after the composite film on the substrate is removed from the deposition chamber and exposed to ambient.

Figure 2E:
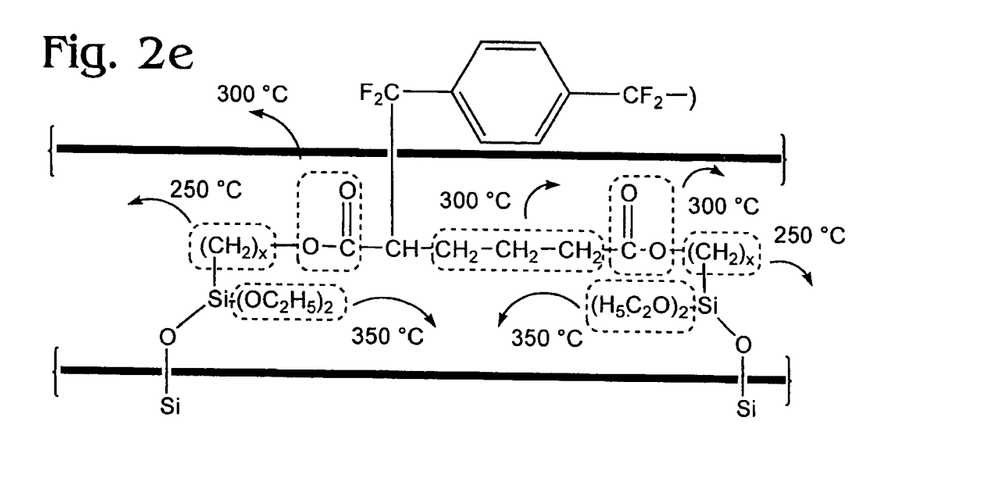

Annealing composite polymer dielectric film 10 may also cause various chemical changes to occur to the first and second adhesion promoter layers. Some examples of possible chemical changes are shown in FIG. 2e. For example, the hydrocarbon chain 30 disposed between the silane functional group and the acrylo functional group may decompose into gaseous hydrocarbons at a temperature of around 300 degrees Celsius. The $CO_2$ group within the acrylo functional group and the terminal *$CH_2$ radical may decompose around 250 degrees Celsius. The ethoxide functional groups may leave as ethanol at 300 to 350 degrees Celsius. The loss of these various functional groups during an annealing process offers the advantage that oxygen is removed from the first and second adhesion promoter layers. The removal of the oxygen at this stage in a device fabrication process may help to prevent problems caused by the oxygen in later device fabrication stages, including but not limited to the formation of bubbles in other layers by oxygen released by later heating stages However, the loss of these functional groups may cause some of the direct covalent linkages between low dielectric constant polymer film 16 and substrate 12 (via first adhesion promoter layer 14) to be broken. For example, before annealing composite polymer dielectric film 10, the composite dielectric film has a yield strength of approximately 50 MPa, which is the tensile strength of the composite polymer dielectric film and is more than an order of magnitude greater than the yield strength in the absence of first adhesion promoter layer 14 (2–3 MPa). After annealing, the yield strength of the composite polymer dielectric film may decrease to around 10 MPa. However, this is still well above the yield strength required for downstream processes, which is around 4–5 MPa.

Figure 2F:
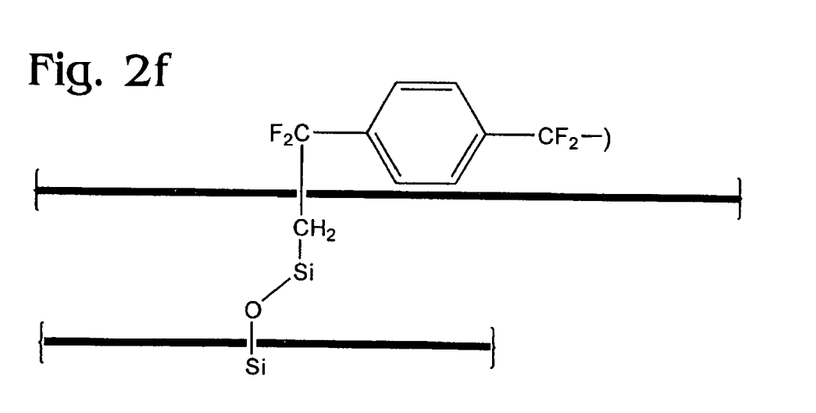

The significant yield strength found after annealing may be attributed to the formation of some covalent bonding formed during the annealing process by the decomposition reactions shown in FIG. 2e. FIG. 2f shows an example of a possible structure that links low dielectric constant polymer layer 16 to substrate 12 via covalent bonding in first adhesion promoter layer 14. It will be appreciated that the structure depicted in FIG. 2f is merely exemplary, and that other structures may also form during an annealing process.

First adhesion promoter layer 14 and second adhesion promoter layer 18 may be formed from any suitable vinyl, keto and/or halide silane materials, including but not limited to those of the general structures (I)—(IV) set forth above.

Silanes of the general structure $(RZ)_x-Si-((CH_2)_3-O-C=O(CH=CH_2)_y$, have a high sensitivity to UV irradiation, and thus allow a shorter exposure time to be used in the production of composite film 10. Other silanes, such as acetylsilanes and vinyl ether silanes, may require a higher energy level of UV irradiation, and therefore may require longer exposure times.

First adhesion promoter layer 14 may be formed from the same silane as second adhesion promoter layer 18, or may be formed from a different silane. Furthermore, while composite polymer dielectric film 10 is depicted as having both a first adhesion promoter layer 14 and a second adhesion promoter layer 18, it will be appreciated that the composite dielectric layer may have only one or the other adhesion promoter layer, depending upon whether the adjacent layers in the integrated circuit are able to bond to the low dielectric constant polymer layer 12 with sufficient strength in the absence of an adhesion promoter layer.

Low dielectric constant polymer layer 16 may also be made from any suitable material, including but not limited to poly(paraxylylene) and fluorinated poly(paraxyxylene) and derivates thereof, and other polyaromatics and fluorinated polyaromatics prepared from a monomer of the general structure.

$$X'_m-Ar-(CZ'Z''Y)_n \qquad (V)$$

In this formula, X' and Y are leaving groups that can be removed to form a free radical for each removed leaving group, Ar is an aromatic group or a fluorine-substituted aromatic group bonded to m X' groups and n CZ'Z''Y groups, and Z' and Z'' are H, F or $C_6H_{5-x}F_x$(x=0, or an integer between 1 and 5). For example, where m=0 and n=2, removal of the leaving group y from each CZ'Z''Y functional group yields the diradical $Ar(CZ'Z''*)_2$. Compounds in which Z' and Z'' are F may have lower dielectric constants and improved thermal stability. Examples of suitable leaving groups for X' and Y include, but are not limited to, ketene and carboxyl groups, bromine, iodine, —$NR_2$, —$N^+R_3$, —SR, —$SO_2R$, —OR, =$N^+$=N—, —C(O)$N_2$, and —OCF—$CF_3$ (wherein R is an alkyl or aromatic group). The numbers m and n in formula (V) may independently be either zero or an integer, and (n+m) is equal to or greater than two, but no greater than the total number of $sp^2$ hybridized carbons in the aromatic group that are available for substitution.

Ar in formula (V) may be any suitable aromatic group. Examples of suitable aromatic groups for Ar include, but are not limited to, the phenyl moiety $C_6H_{4-n}F_n$ (n=0 to 4); the naphthenyl moiety $C_{10}H_{6-n}F_n$ (n=0 to 6); the di-phenyl moiety $C_{12}H_{8-n}F_n$ (n=0 to 8); the anthracenyl moiety $C_{12}H_{8-n}F_n$ (n=0 to 8); the phenanthrenyl moiety $C_{14}H_{8-n}F_n$ (n=0 to 8); the pyrenyl moiety $C_{16}H_{8-n}F_n$ (n=0 to 8); and more complex combinations of the above moieties such as $C_{16}H_{10-n}F_n$ (n=0 to 8). Isomers of various fluorine substitutions on the aromatic moieties are also included. More typically, Ar is $C_6F_4$, $C_{10}F_6$, or $C_6F_4-C_6F_4$.

Low dielectric constant polymer film 16 may also be made from a precursor having the general formula $$X'_mArX''_n \qquad (VI)$$

wherein X' and X'' are leaving groups, and Ar is an aromatic or fluorine-substituted aromatic. The numbers m and n each may be zero or an integer, and m+n is at least two, but no greater than the total number of $sp^2$ hybridized carbon atoms on Ar that are available for substitution. For example, polyphenylene (—($C_6H_4$)—) and fluorine-substituted versions thereof may be formed from a precursor having general formula (VI). Removal of the leaving groups X' and/or X" may create the diradical benzyne ($*C_6H_4*$), which can then polymerize to form polyphenylene. Other aromatic groups besides the phenyl moiety that may be used as Ar in formula (VI) include, but are not limited to, the naphthenyl moiety $C_{10}H_{6-n}F_n$ (n=0 to 6); the diphenyl moiety $C_{12}H_{8-n}F_n$ (n= 0 to 8); the anthracenyl moiety $C_{12}H_{8-n}F_n$ (n=0 to 8); the phenanthrenyl moiety $C_{14}H_{8-n}F_n$ (n=0–8); the pyrenyl moiety $C_{16}H_{8-n}F_n$ (n=0–8); and more complex combinations of the above moieties such as $C_{16}H_{10-n}F_n$ (n=0–10).

First adhesion promoter layer 14, low dielectric constant polymer layer 16, and second adhesion promoter layer 18 may each have any suitable thickness. Depending upon the materials selected for each layer, the material or materials from which first and second adhesion promoter layers 14 and 18 are formed may have a higher dielectric constant than the material from which low dielectric constant polymer layer 16 is formed. In this instance, it may be desirable to utilize relatively thin adhesion promoter layers 14 and 18 compared to the low dielectric constant layer 16. For example, in some embodiments, the thickness of first adhesion promoter layer 14 may range from one molecular layer to approximately 50 angstroms, the thickness of low dielectric constant polymer layer may range from one molecular layer up to 3000 angstroms, and the thickness of second adhesion promoter layer 18 may range from one molecular layer to two hundred angstroms. In the specific case of a PPX-F low dielectric constant layer with a thickness of 1500–3000 angstroms, a first adhesion promoter layer with a thickness of about 10 to 30 angstroms, and a second adhesion promoter layer with a thickness of about 200 to 500 angstroms, the overall dielectric constant of the composite dielectric film is approximately 2.4. It will be appreciated that these thickness ranges are merely exemplary, and that first adhesion promoter layer 14, polymer dielectric layer 16 and second adhesion promoter layer 18 may have any other suitable thicknesses.

Instead of serving as an adhesion promoter layer, second adhesion promoter layer 18 may instead (or additionally) be configured to serve as an etch stop for a later etching process in the fabrication of an integrated circuit, or as a hard mask layer in a single or dual damascene process. Where second adhesion promoter layer 18 is used as an etch stop layer, it may be desirable to use a somewhat thicker second adhesion promoter layer 18 than where the second adhesion promoter layer is not used as an etch stop layer.

Where layer 18 is used as a hard mask layer in a damascene process, layer 18 should etch via a similar chemical process, and at similar rates, as low dielectric constant polymer layer 16. In this case, it may be advantageous for layer 18 to have a lower silicon content. In terms of structure (I) where the silane is an ethoxy silane, a compound of the composition (ETO)—Si—(WT)$_3$ may be used as the hard mask to make the etching characteristics of layer 18 more similar to those of low dielectric constant polymer layer 16 so that the two layers can be etched by similar chemical processes. Examples of suitable etching processes for these two layers include, but are not limited to, $O_2$, $H_2/N_2$, and $NH_3$ etching processes.

On the other hand, where layer 18 is used as an etch stop layer, the silicon content of layer 18 may be increased so that layer 18 is etched at a substantially slower rate than low dielectric constant polymer layer 16. In terms of equation (I) where the silane is an ethoxy silane, layer 18 may have a composition of (ETO)$_3$—Si—(WT) to give layer 18 a substantially slower etching rate than layer 16 for $O_2$, $H_2/N_2$, and $NH_3$ etching processes. On the other hand, a high silicon-content layer 18 may be etched relatively quickly with etching chemistries used for silicon, such as an $SF_4$ etching process.

Figure 3:
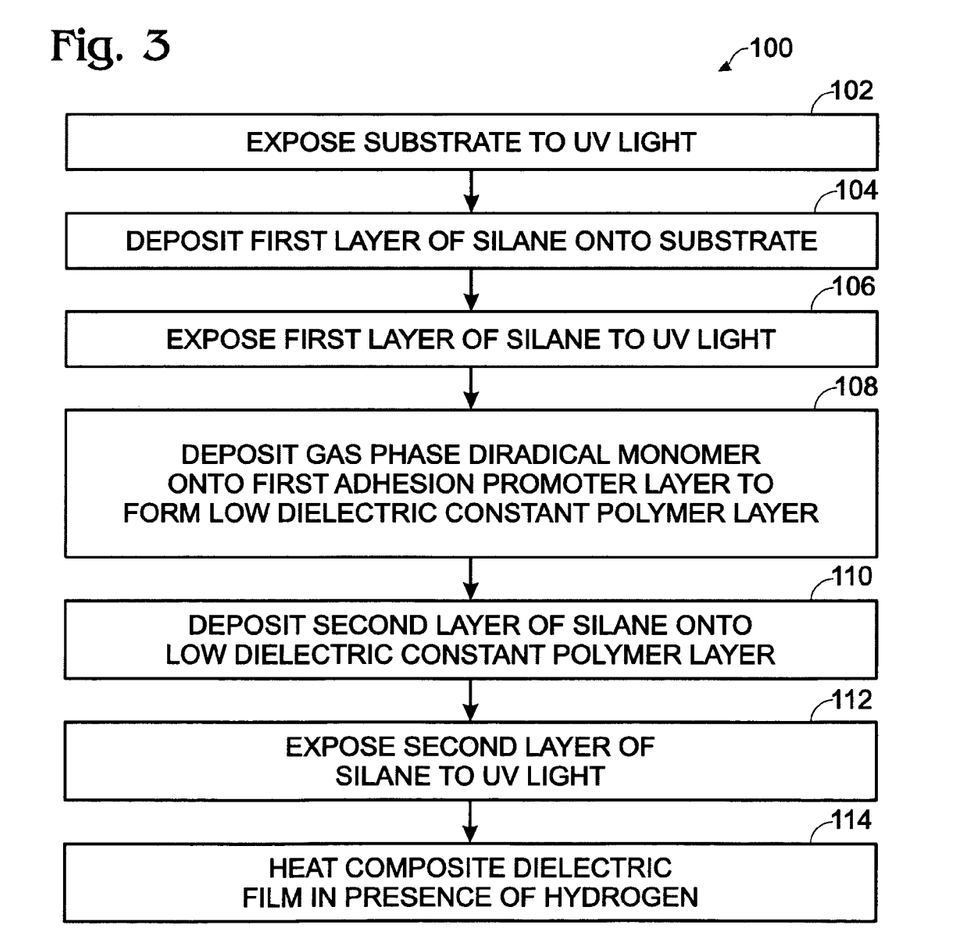
FIG. 3 is a flow diagram showing an embodiment of a method of forming a composite polymer dielectric layer on a substrate.

Composite polymer film 10 may be formed in any suitable manner. FIG. 3 shows, generally at 100, one exemplary method of forming composite polymer dielectric film 10. Method 100 includes, at 102, first exposing a substrate on which the composite film is to be formed to UV light. Exposing the substrate to UV light removes water from the substrate surface, and helps first adhesion promoter layer 14 to adhere more strongly to the substrate surface. Prior methods of removing water from the surface of the substrate include drying the wafer surface with a desiccant, and with a combination of desiccation and heat. It has been found that exposing the substrate to UV light for just a few second helps to achieve the same improvements in adhesion as desiccating the substrate for approximately eight hours, or desiccating and heating the substrate for approximately six hours. Furthermore, it has been found that PPX-F deposited directly onto the surface of the substrate (without use of first adhesion promoter layer 14) after exposing the substrate to UV light has a yield strength of approximately 3–4 MPa. This is a sufficiently high yield strength to withstand integrated circuit later processing steps. However, the use of first adhesion promoter layer 14 provides a much higher yield strength, and therefore provides a much larger margin of safety in a device fabrication process.

After exposing the substrate to UV light at 102, method 100 next includes depositing a first layer of silane onto the substrate at 104. The silane may be a material configured to chemically bond both to the substrate and to a later-deposited low dielectric constant polymer film, including but not limited to the vinyl, keto and halide silanes listed above. The silane may be deposited in any suitable manner. For example, the silane may be deposited by flowing an inert carrier gas, such as nitrogen, containing a concentration of the silane across the surface of the substrate. Alternatively, the first layer of silane may be applied by spin-on coating of a solution of the silane in a solvent such as isopropyl alcohol. The substrate may be held at any suitable temperature while the silane is deposited. In some embodiments, the substrate is held between approximately Zero and –20 degrees Celsius during deposition of the silane in order to increase the adsorption rate and increase system throughput for the deposition of composite film 10. Furthermore, the first layer of silane deposited at 104 may be deposited in a layer of any desired thickness. For example, the silane may be deposited to a thickness of between one molecular layer and approximately 30 angstroms, or may be deposited in a layer thicker than 30 angstroms where suitable.

After depositing the first layer of silane at 104, the first layer of silane is exposed to a free radical-generating energy source, such as UV light, at 106. Exposure to the free radical-generating energy source at 106 generates free radicals from the silane, and may initiate polymerization of the first adhesion promoter layer, for example, if the silane is an acrylo silane. The UV lamp may output UV light of any suitable wavelength, including but not limited to wavelengths between 170 nm and 350 nm. More specifically, wavelengths between 220 and 300 nm may optionally be employed to help to avoid the formation of ozone.

If desired, the amount of UV energy to which the first silane layer is exposed may be limited to only partially polymerize the layer. This may result in the formation of a larger number of unreacted CH* and $CH_2$* radicals for reacting with a subsequently-formed low dielectric constant polymer layer. While the free radical-generating energy source is depicted in FIG. 3 as being a UV lamp, it will be appreciated that any other suitable type of energy source may be used. Examples include, but are not limited to, thermal sources, especially if the silane is a silane. In either case, exposure to the free radical-generating energy source may be performed in the absence of free radical scavengers, including but not limited to oxygen, water, and amino-containing compounds. This may help to avoid growing polymer chains from being terminated by the free radical scavengers. The resulting silane polymers include many pending $Si(ZR)_x$ groups that may bond to the underlying silicon-containing substrate, and also free radical chain ends —$H_2C^*$ capable of reacting with low dielectric constant polymer layer 16.

Next, low dielectric constant polymer film 16 is formed by depositing, at 108, a gas-phase diradical monomer onto first adhesion promoter layer 14. During this process, the substrate may be cooled sufficiently to cause the gas phase diradical monomer molecules to condense on first adhesion promoter layer 14. However, the substrate should not be cooled to such an extent that the gas phase diradical monomer molecules to immediately stick to adhesion promoter layer 14 in any orientation. Instead, the substrate should be cooled to a temperature that allows the gas phase diradical monomer molecules to have sufficient energy to "bounce" on the surface of the first adhesion promoter layer so that the monomer diradical molecules can find an energetically favorable orientation. This may allow the low dielectric constant polymer layer to grow with a relatively high degree of crystallinity. Suitable temperature ranges for achieving this effect may differ depending upon the monomer being deposited. However, in general, temperatures below the melting temperature of the diradical intermediates or the growing low dielectric constant polymers are suitable for achieving this effect. For the diradical monomer $*CF_2C_6H_4CF_2*$, suitable temperatures may include those between approximately −30 and −50 degrees Celsius.

It has been found that, with the temperature held at a suitable level, PPX-F can be deposited from the gas phase diradical monomer $*CF_2C_6H_4CF_2*$ with an initial crystallinity of 20–50% in a $\beta_2$ phase of the material. Furthermore, it has been found that the polymer chains having the 20–50% initial crystallinity have a high degree of alignment along a single crystallographic direction, and that the crystallinity can thus be increased to 70% simply by annealing the film at a temperature higher than the glass transition temperature (approximately 170 degrees Celsius for PPX-F), but lower than the melting temperature of the polymer, for intervals as short as three minutes or less. The low dielectric constant polymer film formed at 108 may be annealed before the second layer of silane material is deposited, or may be annealed after all layers of composite polymer dielectric film 10 have been deposited, as described below.

Next, the second layer of silane is deposited onto the polymer dielectric layer at 110. This layer is then exposed to UV light at 112 to initiate polymerization of the silane molecules to form the second adhesion promoter layer 18 (or an etch stop or hard mask layer), and to react the second adhesion promoter layer, the etch stop or the head mask layer with low dielectric constant polymer layer 16. The second silane layer may be deposited in any suitable thickness As described above, where second silane layer 18 is to be used as an etch-stop or hard mask layer, the second silane layer may be applied in a thicker layer ranging from 200 to 500 angstroms. Likewise, the second silane layer may be applied in a thinner layer ranging from 5 to 20 angstroms when layer 18 is not to be used as an etch-stop or hard mask layer to reduce the impact of the second adhesion promoter layer on the overall dielectric constant of the structure.

The second silane layer may be deposited in any suitable manner, including but not limited to vapor phase deposition techniques, either with or without a carrier gas, and spin-on deposition techniques utilizing a solution of silane in a suitable solvent.

After depositing the second layer of silane onto the low dielectric at 110 and exposing the second layer of silane to UV light (or other free radical-generating energy source) at 112, the composite polymer dielectric film may be annealed in the presence of a reducing gas, such as hydrogen, at 114. After formation of the composite polymer dielectric film, many unreacted free radicals $*CH$, $*CH_2$, and $*CF_2$ may remain in the layers making up the composite film. Annealing in the presence of hydrogen may eliminate these free radicals before composite polymer dielectric film 10 is removed from the deposition system environment to avoid reactions with water, oxygen or nitrogen compounds that may cause problems in later processing stages. Furthermore, annealing in the presence of hydrogen may help to increase the number of Si—Z—Si bonds that are formed between the silane end of the silane molecule and adjacent silicon-containing layers. Annealing also may help to improve the crystallinity of the low dielectric constant polymer layer. For example, as described above, the crystallinity of the polymer chains of the low dielectric constant polymer material may improved from 20-50% to about 70% during this annealing step.

Composite polymer dielectric film 10 may be annealed at any suitable temperature, and under any suitable concentration of hydrogen and/or mixture of hydrogen with other inert gases such as noble gases. Depending upon the temperature regime used, nitrogen may not be suitable for this process, as nitrogen may react with radicals in the composite film under annealing conditions. Examples of suitable annealing temperatures include, but are not limited to, temperatures sufficient to promote the reactions of free radicals in the composite polymer film with hydrogen, yet that are below the melting points of the low dielectric constant polymer layers. In the specific case of a composite film formed from an acrylic or methacrylic silane and PPX-F, annealing temperatures of between 300 and 400 degrees Celsius may be sufficient to eliminate free radicals within composite polymer dielectric film 10, and to increase the crystallinity of the PPX-F layer and to create a chemically, electrically and dimensionally stabilized film.

Composite polymer dielectric film 10 may be annealed under any suitable pressure and concentration of hydrogen. For example, composite polymer dielectric film 10 may be annealed under pure hydrogen gas (of any suitable purity), or may be annealed under hydrogen gas diluted in another inert gas. Examples of suitable diluent gases include, but are not limited to, inert gases such as argon or helium. The total pressure while annealing composite polymer dielectric film 10 may be between approximately 200 mTorr to 500 Torrs, and more typically between approximately 1 to 20 Torrs.

Likewise, composite polymer dielectric film 10 may be heated using any suitable heat source. For example, a hotplate may be used to heat composite polymer dielectric film 10 during annealing, or an indirect radiative heat source may be used.

Composite polymer electric film 114 may be annealed under hydrogen for any suitable amount of time. For example, in the specific case of a composite film formed from an acrylic or methacrylic silane and PPX-F annealed at a temperatures of between 300 and 400 degrees Celsius, an annealing time of between 2 and 10 minutes on a hot plate may be sufficient to eliminate free radicals and to increase the crystallinity of the PPX-F layer.

While the embodiment of FIG. 3 shows both the first silane layer and the second silane layer as being individually exposed to a free radical-generating energy source after the layers are deposited, it will be appreciated that polymerization of either the first silane layer, the second silane layer, or both the first and second silane layer may be initiated after all three layers have been deposited. In this instance, heat may be applied to the composite dielectric polymer film in the absence of hydrogen (and any free radical scavenging species) for a first interval to cause reaction with low dielectric constant layer 16 and, depending upon the chemical properties of the silane material, polymerization of these layers, and then heat may be applied for a second interval in the presence of hydrogen to eliminate any remaining free radicals.

Figure 4:
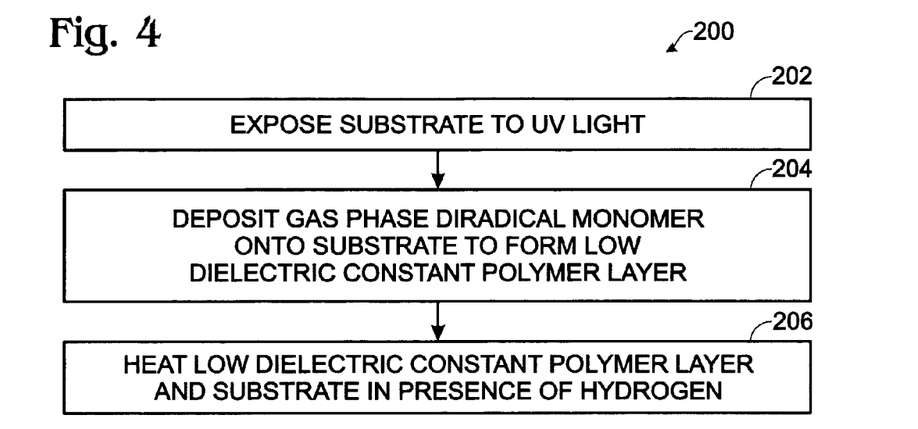
FIG. 4 is a flow diagram showing another embodiment of a method of forming a polymer dielectric layer on a substrate.

As described above, even in the absence of first adhesion promoter layer 14, the adhesion of low dielectric constant polymer layer 16 may be improved by exposing the substrate to UV light for a brief interval before exposing the substrate to the diradical monomer to create the low dielectric constant polymer layer. FIG. 4 shows, generally at 200, an embodiment of a method of forming a low dielectric constant polymer film in this manner. Method 200 includes first, at 202, exposing the substrate to UV light to remove water (and possibly other contaminants) from the surface of the substrate. The substrate may be exposed to any suitable wavelength of UV light, and for any suitable interval. For example, the substrate may be exposed to UV light between 170 nm and 350 nm, or more specifically between 220 and 300 nm.

After exposing the substrate to UV light at 202, the substrate may next be exposed at 204 to a gas phase diradical monomer, such as one generated from the compounds disclosed above in structures (V) and (VI), to form the low dielectric constant polymer layer. The substrate may be maintained in a high vacuum environment between exposure to the UV light at 202 and exposure to the gas phase diradical monomer at 204 to prevent the substrate surface from being re-contaminated by water or other contaminants. To maintain a sufficiently pure environment during deposition, the deposition system may be configured to have a leakage rate of less than approximately 2 mTorr/minute, and more specifically less than about 0.4 mTorr/min. After completing the growth of the low dielectric constant polymer film at 204, the low dielectric constant polymer layer may be annealed in the presence of hydrogen, as described above in the context of FIG. 3.

Figure 5:
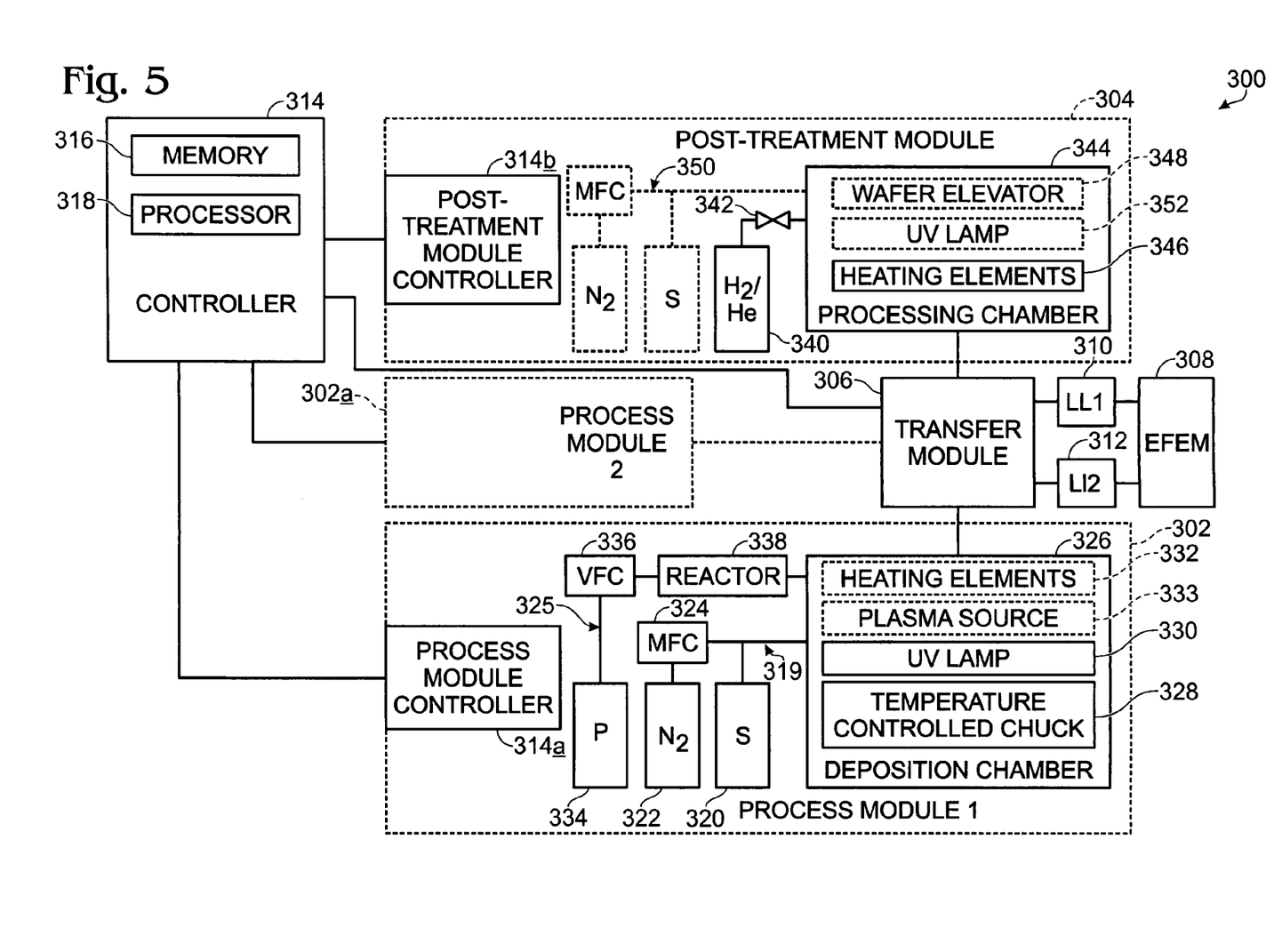
FIG. 5 is a block diagram of an exemplary embodiment of a system for forming a composite dielectric layer on a substrate.

FIG. 5 shows, generally at 300, a block diagram of an exemplary system for forming composite dielectric polymer system 10. System 300 is described in the context of a system for depositing a PPX-based polymer, but it will be appreciated that system 300 may be adapted for use with any other suitable low dielectric constant polymer film. System 300 includes one or more process modules 302 (a second process module is shown generally at 302a), a post-treatment module 304, a transfer module 306 connecting the process module 302 and the post-treatment module 304, an equipment front-end module 308 (EFEM) that interfaces system 300 with an exterior environment, and first and second load locks 310 and 312 for respectively introducing substrates into and removing substrates from transfer module 306.

System 300 also has a system controller 314 including memory 316 having instructions stored thereon that are executable by a processor 318 for controlling the various parts of system 300 to effect the formation of composite polymer dielectric film 10. Controller 314 is depicted in FIG. 5 as having electrical connections to a process module controller 314a on process module 302, a post-treatment controller 314b on post-treatment module 304, and to transfer module 306 (which may also include its own controller, not shown). However, it will be appreciated that controller 314 may have electrical connections to any other component having electrical systems, including but not limited to load lock 310, load lock 312, equipment front end module 308, and any sub-components contained within the general components shown in FIG. 5. The depicted system configuration allows all three layers of composite polymer dielectric film 10 to be deposited and annealed without breaking the deposition vacuum, and thus achieving high system throughputs while increasing manufacturing yields.

It will be appreciated that the electrical portion of FIG. 5 merely sets forth an exemplary hardware architecture, and does not indicate a particular physical relationship between the system controller and individual module controllers. Moreover, it will be appreciated that the depicted hardware architecture is merely exemplary, and that system 10 may utilize any other suitable architecture. For example, a single controller may be used to control all functions of all modules, rather than having a controller for each module. Furthermore, while only system controller 314 is depicted as having memory and a processor, each of the individual module controllers typically also has memory and one or more processors associated therewith.

Process module 302 is configured to form first adhesion promoter layer 14, low dielectric constant polymer layer 16, and second adhesion promoter layer 18. Process module 302 includes a silane delivery system 319 with a silane container 320 and a carrier gas source 322 (typically nitrogen or other suitable inert gas) fluidically connected with the silane container via a mass flow controller 324. Process module 302 also includes a gas phase monomer delivery system 325, described in more detail below.

Silane delivery system 319 is configured to deliver a flow of a silane into a deposition chamber 326 for forming first adhesion promoter layer 14 and second adhesion promoter layer 18 on a substrate in the deposition chamber. In addition to mass flow controller 324, various valves (not shown) may be disposed between silane container 320 and deposition chamber 326 to regulate the flow of into the deposition chamber.

System controller 314 electronically communicates with process module controller 314a to start and finish the silane deposition process, while process module controller 314a directs process module 302 to perform the various functions and operations that produce layers 14, 16 and 18 of composite polymer dielectric film. For example, process module controller 314a maintains the clean vacuum environment for deposition chamber 326 and reactor 338 via a vacuum pump system (not shown), controls the temperature distribution of the heating elements 332, delivers a desired amount of PPX precursor from precursor canister 334 into deposition chamber 326 through vapor flow controller 336 and reactor 338, and effects the UV lamp 330 to remove water from the substrate surface, etc.

To effect the silane deposition process, process module controller 314a maintains a desired gas pressure and mixture within the deposition chamber 326. For example, the base pressure within deposition chamber 326 may be held below 0.5 mTorr, and more specifically below 0.05 mTorr and during deposition of the silane at 200 mTorr to 500 Torrs, preferably between 2 to 20 Torrs. Alternatively, higher pressures may be employed.

Process module controller 314a may introduce silane precursor into deposition chamber 326 at any suitable rate. The rate and/or amount of silane that is introduced into deposition chamber 326 may be controlled by controlling the temperature of the silane container (which affects the vapor pressure of gas phase silane in the container) and the flow rate of nitrogen into the deposition chamber 326. Examples of suitable silane temperatures and nitrogen flows include temperatures in the range of 10 and 50 degrees Celsius, and flow rates between 50 and 500 sccm, although silane temperatures and nitrogen flow rates outside of these ranges may also be used. It will be appreciated that silane container 320 may include various heaters, temperature controllers, level detectors, and other components electrically coupled to and controlled by controller 314 that are not shown in the high-level block diagram of FIG. 5. Likewise, other components shown in FIG. 5 may include various detectors, pumps, temperature control systems, etc. that have been omitted from FIG. 5 for purposes of clarity.

Deposition chamber 326 may include a temperature-controlled chuck 328 for maintaining a substrate at a controlled temperature within the chamber. Temperature-controlled chuck 328 may be an electrostatic chuck, and may include a gas outlet configured to allow a desired pressure of a heat transfer gas to be maintained between the substrate and chuck surface, thus helping to maintain the substrate surface at a substantially uniform temperature. For example, maintaining helium at a pressure of up to 10 psi between the substrate and chuck has been found to keep the temperature across the surface of the substrate within one degree Celsius of a desired target temperature. Furthermore, the use of an electrostatic chuck as temperature-controlled chuck 328 may provide sufficient holding force between the chuck and the substrate to keep the leak rate for helium below 0.4 sccm.

Deposition chamber 326 may also include a UV lamp 330 configured to illuminate a substrate positioned on temperature-controlled chuck 328. UV lamp 330 may be used both to remove water (and other contaminants) from a substrate surface prior to depositing any film layers on the substrate, and also may be used to cause the free radical polymerization of the adhesion promoter layers and the chemical bonding of the adhesion promoter layers with the low dielectric polymer layer. Deposition chamber 326 may, alternatively or additionally, include heating elements 332 or a plasma source 333 for causing the polymerization of the silane layers. UV lamp 330 and/or heating elements 332 may be positioned outside of deposition chamber 326 and irradiate through a quartz (or other UV-transparent material) window provided in the deposition chamber. Alternatively, a suitable UV lamp may be positioned within the deposition chamber.

Deposition chamber 326 may be configured to have a low leakage rate and to hold a high vacuum to help avoid the introduction of free radical scavenger species, such as oxygen and amino-containing compounds, during the various layer deposition and polymerization processes. For example, deposition chamber 326 may be configured to hold a vacuum of less than 0.01 mTorr during the deposition of the low dielectric constant polymer layer, and have a leakage rate of less than approximately 2 mTorr/minute, and in some embodiments, as low as 0.4 mTorr/minute or less.

Process module 302 also includes a gas phase monomer delivery system 325 for delivering a low dielectric constant polymer free radical intermediate to deposition chamber 326. Gas phase monomer delivery system 325 includes a precursor vessel 334 for holding a precursor material, a vapor flow controller 336 for regulating the flow of vapor phase precursor out the vessel, and a reactor 338 for creating a gas phase free radical intermediate from the precursor. For example, where the precursor is the monomer $CF_2BrC_6H_4CF_2Br$, reactor 338 may convert the precursor to the diradical $*CF_2C_6H_4CF_2*$ for the formation of a PPX-F film. Furthermore, reactor 338 may be configured to chemically react with the bromine leaving groups and to be periodically regenerated to remove bromine from the reactor. Examples of suitable reactors include those disclosed in U.S. patent application Ser. No. 10/243,990 of Lee et al., filed Sep. 13, 2002, the disclosure of which is incorporated by reference.

Process module controller 314a may be configured to maintain precursor vessel 334 at any suitable temperature for producing a desired vapor pressure of precursor monomer. For example, where $BrCF_2C_6H_4CF_2Br$ is the monomer precursor, process module controller 314a may maintain precursor vessel 334 at a temperature of between approximately 40 and 90 degrees Celsius to create a sufficient vapor pressure of the monomer. Likewise, process module controller 314a may be configured to maintain any suitable rate of flow of vapor phase precursor into reactor 338 via vapor phase controller 336. Examples of suitable flow rates of precursor into reactor 338 include, but are not limited to, flow rates of between 1 and 50 sccm, +/−1 sccm.

As mentioned above, system 300 may include one or more process modules 302. While the embodiment depicted in FIG. 5 includes two process modules 302, it will be appreciated that system 300 could include three or more process modules if desired. The use of multiple process modules may help to increase substrate throughput. Alternatively, a designated process chamber for deposition of the first and second silane layers can also be employed where more than two process modules are included in a deposition system, as described in more detail below.

Post-treatment module 304 is configured to perform the above-described post-deposition heating and/or annealing processes. Furthermore, post-treatment module 304 may be configured to perform the deposition of first adhesion promoter layer 14, second adhesion promoter layer 18, or both adhesion promoter layers instead of (or in addition to) process modules 302 and 302a. Post-treatment module 304 includes an annealing gas source 340, at least one valve 342 to control a flow of annealing gas from the annealing gas source 340 into a processing chamber 344, and one or more heating elements 346 for heating a substrate during an annealing process.

Processing chamber 344 may be configured to process substrates One at a time, or may be equipped for batch processing, with such features as a wafer elevator 348, etc., where equipped for batch processing, processing chamber 344 may include a plurality of heating elements 346 to provide consistent heating to each of a plurality of wafers being processed. The use of a wafer elevator 348 allows a plurality of substrates in processing chamber 344 to be vertically stacked, which may help to reduce the footprint of processing chamber 344 relative to a batch processor in which the substrates are not vertically stacked. The number of heating elements 346 and the height of wafer elevator 348 is determined at least in part by the number of process modules 302 used in system 300.

Processing chamber 344 of post-treatment module 304 may be configured to have a low leakage rate and be able to hold a high vacuum to help avoid the introduction of free radical scavengers such as $O_2$ and $H_2O$ from outside of the chamber. Examples of suitable leak rates for processing chamber 344 of post-treatment module 304 include, but are not limited to, rates below about 2 mTorr/minute. Heating elements 346 of post-treatment module 304 may be radiant heaters, one or more hotplates on which substrates rest during processing, or may take any other suitable form. Heating elements 346 are controllable by controller 314 to heat a substrate to any suitable temperature for annealing. In the specific case of a PPX-F low dielectric constant polymer film, the heating elements may be configured to heat the substrates to a constant controlled temperature of between approximately 300–450 (+/–2–5) degrees Celsius.

Post-treatment module 304 may also be configured to deposit first adhesion promoter layer 14 and/or second adhesion promoter layer 318. In this instance, post-treatment module 304 may include a silane precursor delivery system 350 configured to deliver a flow of silane precursor into processing chamber 344 for forming first adhesion promoter layer 14 and second adhesion promoter layer 18. Silane precursor delivery system 350 may be similar in structure and function to silane precursor delivery system 319 described above in the context of process module 302. Post-treatment module 304 also may include a UV lamp (or other free radical-generating energy source, such as a plasma source) for polymerizing the silane precursor.

Post-treatment module controller 314b directs post-treatment module 304 to perform the various functions and operations that go into the post-deposition processing of composite polymer dielectric film 10. For example, post-treatment module controller 314b regulates the composite film annealing temperature through heating elements 346, maintains prescribed hydrogen/helium pressure within processing chamber 344 via the gas source 340 and controlling valve 342, and controls the vertical indexing motion of the wafer elevator 348 for wafer transfer into and out of post-treatment module 304. System controller 314 may communicate with post-treatment module controller 314b to cause the post-treatment module controller to start and stop these processes.

Transfer module 306, equipment front end module 308, load lock 310 and load lock 312 each may be considered part of a platform that supports use of process module(s) 302 and post-treatment module 304. During a deposition process, a substrate is loaded initially into equipment front-end module 308, where alignment systems within the equipment front-end module pre-align the substrate. The substrate is then moved via a mechanical arm or other transfer apparatus (not shown in FIG. 5) within equipment front-end module 308 to load lock 310, which is pumped down to a pressure of a few mTorr. From load lock 310, another substrate transfer apparatus (not shown in FIG. 5) within transfer module 306 transfers the substrate from load lock 310 into the transfer module, and then into the silane deposition module for an initial exposure to UV light and/or deposition of the first adhesion promoter layer.

Transfer module 306 is also controllable by controller 314 to transfer a substrate among process module(s) 302 and post-treatment module 304 at appropriate times during the manufacture of composite dielectric polymer film 10. To help prevent reaction of unreacted free radicals in composite dielectric film with free radical scavengers while the substrate is being transferred between process module(s) 302 and post-treatment module 304, transfer module 306 may be maintained at a suitable level of vacuum. Suitable levels of vacuum include, but are not limited to, pressures below 0.1 mTorr. Maintaining transfer module 306 at pressures in this range may help to avoid the introduction of harmful quantities of free radical scavengers into transfer module 306, and thus may help to prevent unwanted reactions.

Once all processing steps have been completed, transfer module 306 may be controlled by controller 314 to transfer a substrate into load lock 312, where it may be brought back to the pressure of equipment front-end module 308 for removal from system 300.

Figure 6:
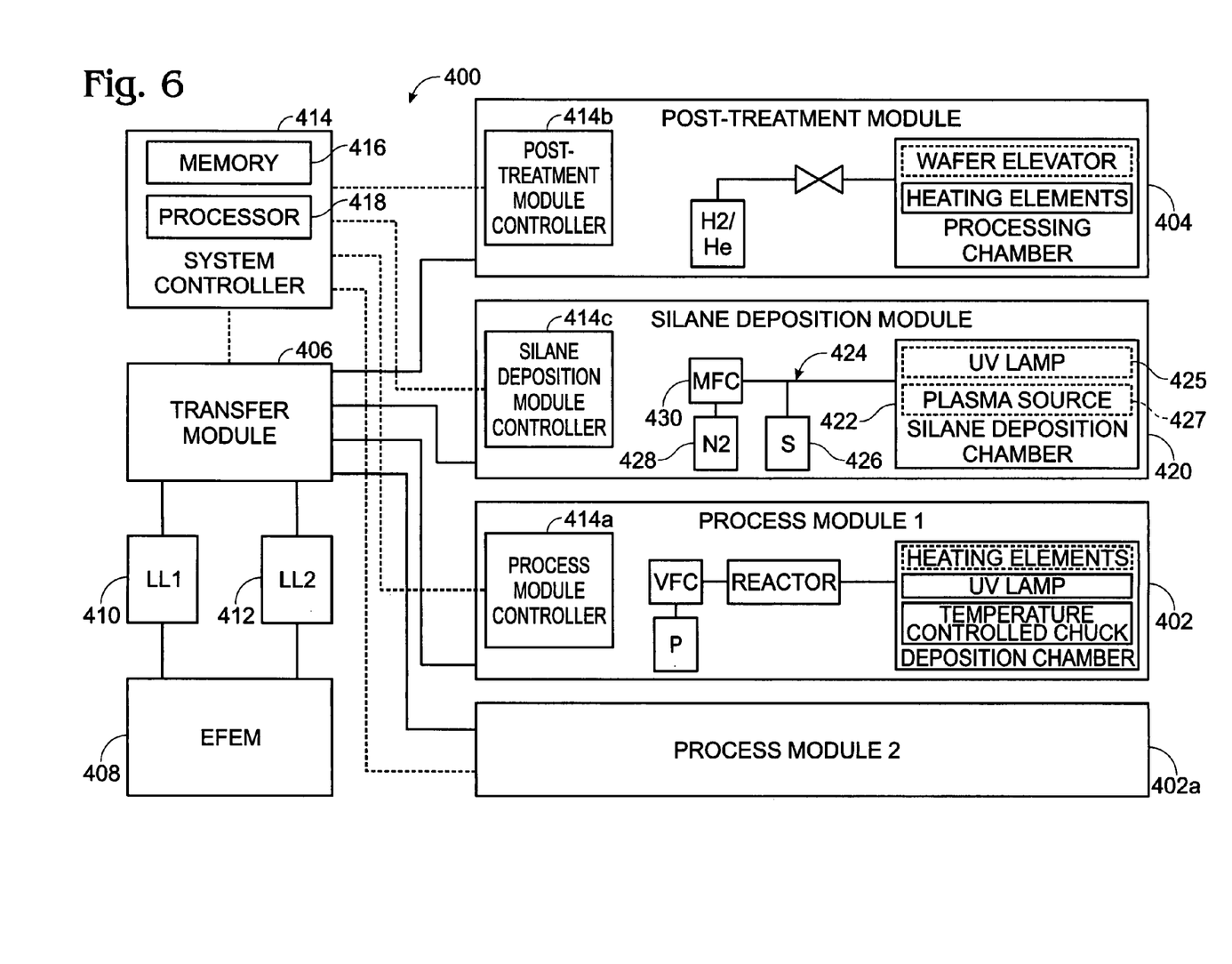
FIG. 6 is a block diagram of another exemplary embodiment of a system for forming a composite dielectric layer on a substrate.

FIG. 6 shows, generally at 400, a block diagram of another exemplary system for forming composite dielectric polymer system 10. Like system 300, system 400 includes one or more process modules 402 (a second process module is shown generally at 402a), a post-treatment module 404, a transfer module 406 connecting the process module 402 and the post-treatment module 404, an equipment front-end module 408 (EFEM) that interfaces system 400 with an exterior environment, and first and second load locks 410 and 412 for respectively introducing substrates into and removing substrates from transfer module 406. System 400 also includes a system controller 414 including memory 416 having instructions stored thereon that are executable by a processor 418 to control the various functions of system 400. System controller 414 may interface with separate module controllers 414a, 414b, which control the individual functions of each module.

System 400 also includes a separate silane deposition module 420 for depositing layers 14 and 18 of composite polymer dielectric film 10. Silane deposition module 420 includes a: silane deposition chamber 422 to which a silane delivery system 424 is connected. Silane delivery system 424 is configured to deliver a flow of a silane into silane deposition chamber 422 for forming first adhesion promoter layer 14 and second adhesion promoter layer 18 on a substrate positioned in the silane deposition chamber. Silane delivery system 424 includes a silane container 426 and a carrier gas source 428 (typically nitrogen or other suitable inert gas) fluidically connected with the silane container via a mass flow controller 430. Other valves may be disposed between silane container 426 and silane deposition chamber 422 preventing or allowing silane to flow into the silane deposition chamber.

Silane deposition chamber 422 may include a free radical-generating energy source for creating free radicals in the silane molecules to allow the polymerization of the silane molecules, and reactions between the silane molecules and the low dielectric constant polymer layer. One example of a suitable free radical generating source is a UV lamp 425. UV lamp 425 may also be used to remove water from substrate surfaces prior to depositing layer 14 of composite polymer dielectric film 10. Alternatively, another energy source, such as a plasma source 427 or a thermal energy source, may be used.

Silane deposition module 420 also includes a silane deposition module controller 414c for controlling the various processes and operations of the silane deposition process, including but not limited to the delivery of silane precursor from the silane canister to the deposition chamber, and the temperature of temperature controlled chuck. System controller 414 electronically communicates with silane deposition module controller 414c to start and finish the silane deposition process. To effect the silane deposition process, silane deposition module controller maintains the gas pressure of the silane deposition chamber, the temperature of the silane precursor, the flow of the carrier gas, etc. For example, the base pressure within silane deposition chamber may be held below 0.5 mTorr, and more specifically below 0.05 mTorr. During deposition of the silane, pressure within silane deposition chamber 424 may be held at a pressure of between approximately 200 mTorr and 500 Torrs, and more specifically between 2 to 20 Torrs. Alternatively, higher pressures may be employed.

Silane deposition module controller 414c may be configured to introduce silane into silane deposition chamber at any suitable rate. Examples of suitable silane temperatures and nitrogen flows include temperatures in the range of 10 and 50 degrees Celsius, and flow rates between 50 and 500 sccm, although silane temperatures and nitrogen flow rates outside of these ranges may also be used. It will be appreciated that silane container 320 may include various heaters, temperature controllers, level detectors, and other components electrically coupled to and controlled by silane deposition module controller that are not shown in the high-level block diagram of FIG. 6. Likewise, other components shown in FIG. 6 may include various detectors, pumps, temperature control systems, etc. that have been omitted from FIG. 6 for purposes of clarity.

While the depicted silane deposition module includes only a single silane delivery system, it will be appreciated that the silane deposition module may include plural silane delivery systems. For example, where first adhesion promoter layer 14 is made of a silane having the general formula $(ETO)_3$—Si—(WT) while third adhesion promoter layer 18 is made of a silane having the general formula (ETO)—Si—$(WT)_3$, the silane deposition module may have a separate silane delivery system for each of these silanes.

Figure 7:
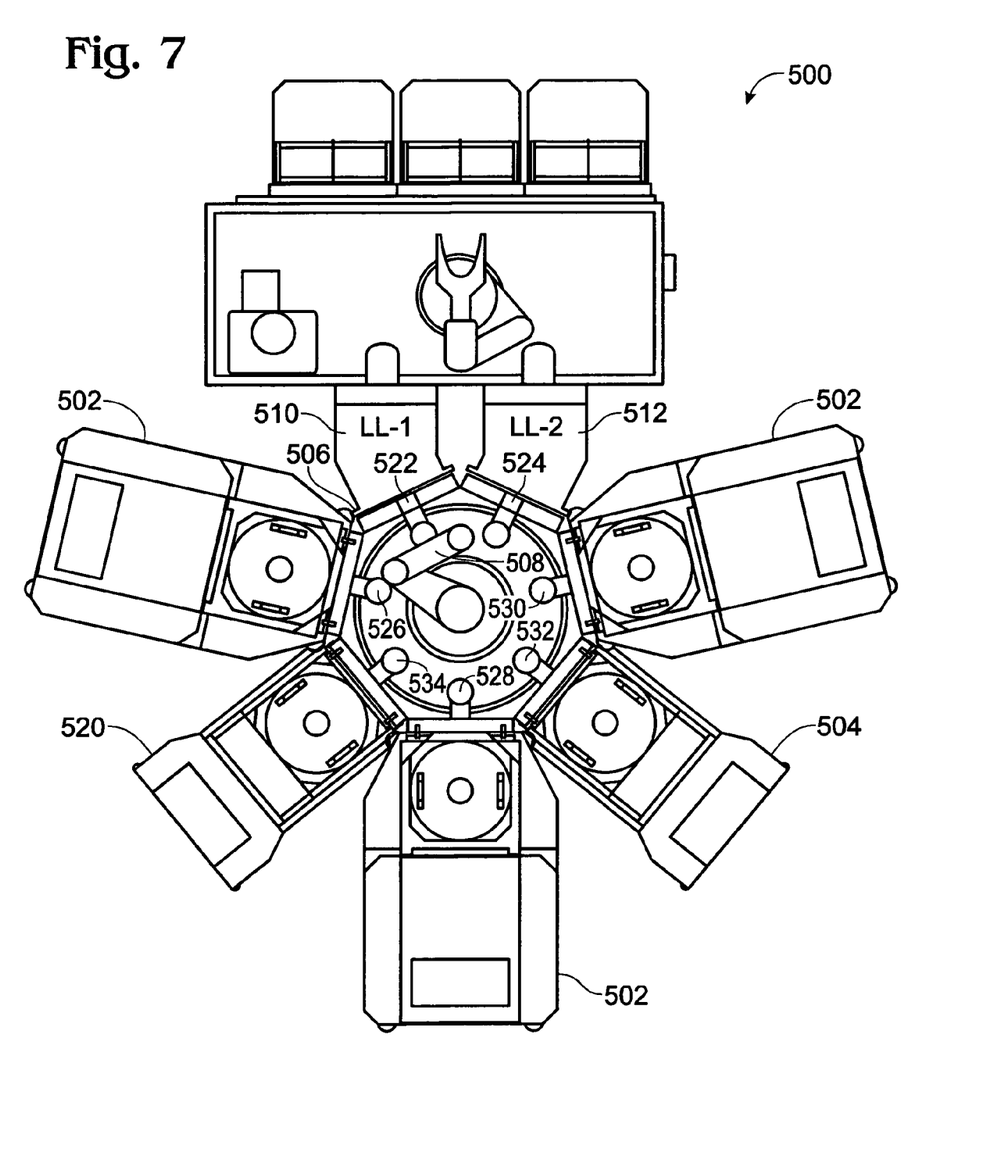
FIG. 7 is a plan view of an exemplary embodiment of a system for forming a composite dielectric layer on a substrate.

FIG. 7 shows, generally at 500, a plan view of an embodiment of a processing system for forming composite dielectric film 10 arranged on a fabrication room floor. System 500 includes three process modules 502, one post-treatment module 504, and one silane deposition module 520. A transfer module 506 is disposed in a central location, and the process modules 502, post-treatment module 504, and load locks 310 and 312 are disposed around the transfer module. Transfer module 506 includes a pivotal mechanical arm 508 configured to transfer a wafer between wafer conveyors 522 and 524 on load locks 510 and 512, respectively, wafer conveyors 526, 528 and 530 on process modules 502, and wafer conveyor 532 on post-treatment module 304. The depicted configuration of system 500 allows a substrate to be transferred between load locks 510 and 512, transfer module 506, process modules 502, post-treatment module 504 without breaking the overall system vacuum. Substrates may be sequentially processed in process modules 502, and then annealed in post-treatment module 504 in a batch manner for a high system throughput. Using the above-disclosed processing equipment and conditions, composite polymer dielectric film 10 can be deposited and annealed on a wafer in 4 to 6 minutes, which is within the time tolerances dictated by the overall fabrication speed of typical integrated circuit processing lines. It will be appreciated that the configuration shown in FIG. 7 is merely exemplary, and that any other suitable arrangement of the various components of systems 300 and/or 400 may be used.

Although the present disclosure includes specific embodiments of various composite dielectric films, methods of forming the films, and systems for forming the films, specific embodiments are not to be considered in a limiting sense, because numerous variations are possible. The subject matter of the present disclosure includes all novel and nonobvious combinations and subcombinations of the various films, processing systems, processing methods and other elements, features, functions, and/or properties disclosed herein. The following claims particularly point out certain combinations and subcombinations regarded as novel and nonobvious. These claims may refer to "an" element or "a first" element or the equivalent thereof. Such claims should be understood to include incorporation of one or more such elements, neither requiring nor excluding two or more such elements. Other combinations and subcombinations of features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

What is claimed is:

1. A method of making an integrated circuit, the integrated circuit including a composite dielectric layer having a first silane-containing layer, a second silane-containing layer, and a low dielectric constant polymer layer disposed between the first and second silane-containing layers, the method comprising:
   depositing the first silane-containing layer on the substrate;
   depositing the low dielectric constant polymer layer on the first silane-containing layer; and
   depositing the second silane-containing layer on the low dielectric constant polymer layer,
   wherein the low dielectric constant polymer layer is deposited by exposing the first silane-containing layer to a concentration of a gas phase diradical monomer, and condensing and polymerizing the gas phase monomer on the first silane-containing layer.

2. The method of claim 1, wherein the substrate is maintained below a crystallization temperature of the low dielectric constant polymer layer while the low dielectric constant polymer layer is being deposited.

3. The method of claim 1, wherein the low dielectric constant polymer layer is at least partially formed from a poly(paraxylylene) having a general formula of —(—C$(F_xH_{2-x})$—$(C_6F_yH_{4-y})$—C$(F_xH_{2-x})$—)—, wherein x=0, 1 or 2, and wherein y=0, 1, 2, 3 or 4.

4. The method of claim 3, wherein the gas phase monomer is a diradical a diradical monomer having a general formula of Ar—(CZ'Z"*)$_2$, wherein Ar is an aromatic group or a fluorine-substituted aromatic group.

5. The method of claim 4, wherein the substrate is maintained at a temperature below the crystallization temperature of the diradical while the low dielectric constant polymer layer is deposited.

6. The method of claim 5, wherein the substrate is maintained at a temperature of between −30 and −50 degrees Celsius while the low dielectric constant polymer layer is deposited.

7. A method of making an integrated circuit, the integrated circuit including a composite dielectric layer having a first silane-containing layer, a second silane-containing layer, and a low dielectric constant polymer layer disposed between the first and second silane-containing layers, the method comprising:
   depositing the first silane-containing layer on the substrate;
   depositing the low dielectric constant polymer layer on the first silane-containing layer; and
   depositing the second silane-containing layer on the low dielectric constant polymer layer,
   wherein the first silane-containing layer is formed at least partially from an organosilane material selected from materials having a general formula of $(RZ)_x$—Si—$(W—T)_y$, wherein W is selected from the group consisting of —O—, —CH$_2$—, —(CH$_2$)$_a$—OO=C—, and —(CH$_2$)$_a$—OO=C—; wherein T is selected from the group consisting of —CR=CR'R", an alkyl halide, and —RC=O; wherein Z is selected from the group consisting of O and NR, wherein R, R' and R" are an H, alkyl or aromatic group; wherein a is 0 or an integer; wherein x=1, 2 or 3; wherein y=1, 2 or 3; and wherein x+y=4.

8. The method of claim 7, wherein the substrate contains silicon, and wherein the first silane-containing layer is chemically bonded to the substrate via a plurality of Si—Z—Si bonds (Z=O or NR, where R is an alkyl or aromatic compound) formed between silane groups in the first silane-containing layer and the silicon in the substrate.

9. A method of making an integrated circuit, the integrated circuit including a composite dielectric layer having a first silane-containing layer, a second silane-containing layer, and a low dielectric constant polymer layer disposed between the first and second silane-containing layers, the method comprising:
  depositing the first silane-containing layer on the substrate;
  depositing the low dielectric constant polymer layer on the first silane-containing layer; and
  depositing the second silane-containing layer on the low dielectric constant polymer layer,
  further comprising exposing the first silane-containing layer to at least one of UV radiation and heat before depositing the low dielectric constant polymer layer to create free radicals from vinyl groups in the first silane-containing layer.

10. A method of making an integrated circuit, the integrated circuit including a composite dielectric layer having a first silane-containing layer, a second silane-containing layer, and a low dielectric constant polymer layer disposed between the first and second silane-containing layers, the method comprising:
  depositing the first silane-containing layer on the substrate;
  depositing the low dielectric constant polymer layer on the first silane-containing layer; and
  depositing the second silane-containing layer on the low dielectric constant polymer layer,
  further comprising exposing the second silane-containing layer to at least one of UV radiation and heat after depositing the second silane-containing layer to chemically bond the second silane-containing layer to the low dielectric constant polymer layer.

11. A method of making an integrated circuit, the integrated circuit including a composite dielectric layer having a first silane-containing layer, a second silane-containing layer, and a low dielectric constant polymer layer disposed between the first and second silane-containing layers the method comprising:
  depositing the first silane-containing layer on the substrate;
  depositing the low dielectric constant polymer layer on the first silane-containing layer; and
  depositing the second silane-containing layer on the low dielectric constant polymer layer,
  further comprising heating the composite dielectric layer in the presence of hydrogen after depositing the second silane-containing layer.

12. The method of claim 11, wherein heating the composite dielectric layer under hydrogen includes heating the composite dielectric layer under a mixture of 3–10% hydrogen in an inert gas.

13. The method of claim 11, further comprising exposing the second silane-containing layer to thermal energy to chemically react the second silane-containing layer with the low dielectric constant polymer layer before heating the composite dielectric layer in hydrogen.

14. The method of claim 11, further comprising exposing the second silane-containing layer to UV radiation before heating the composite dielectric layer in the presence of hydrogen to react the second silane-containing layer with the low dielectric constant polymer layer.

15. The method of claim 11, wherein the composite dielectric layer is heated under hydrogen for 0.5–10 minutes.

16. The method of claim 15, wherein the composite dielectric layer is heated under hydrogen for 3–4 minutes.

17. The method of claim 11, wherein the composite dielectric layer is heated under hydrogen to a temperature of 300–400 degrees Celsius.

18. A method of making an integrated circuit, the integrated circuit including a composite dielectric layer having a first silane-containing layer, a second silane-containing layer, and a low dielectric constant polymer layer disposed between the first and second silane-containing layers, the method comprising:
  depositing the first silane-containing layer on the substrate;
  depositing the low dielectric constant polymer layer on the first silane-containing layer; and
  depositing the second silane-containing layer on the low dielectric constant polymer layer,
  wherein the substrate includes a surface, further comprising exposing the substrate to UV radiation before depositing the first silane-containing layer to remove water from the substrate surface.

19. A method of making an integrated circuit, the integrated circuit including an adhesion promoter layer disposed on a substrate and a low dielectric constant polymer layer disposed on the adhesion promoter layer, the method comprising:
  depositing a silane material onto the substrate;
  exposing the silane material to a free radical generating energy source to generate free radicals from vinyl functional groups on the silane material, wherein some free radicals react to form the adhesion promoter layer, and wherein other free radicals are available to react with the low dielectric constant polymer layer;
  depositing the low dielectric constant polymer layer on the adhesion promoter layer by exposing the substrate to a concentration of a gas phase free radical, wherein at least some of said other free radicals react with the low dielectric constant layer as it is deposited; and
  heating the adhesion promoter layer and the polymer dielectric in the presence of a reducing gas.

20. The method of claim 19, wherein the low dielectric constant polymer layer is deposited while the substrate is held at a temperature of between approximately −30 and −50 degrees Celsius.

21. The method of claim 19, wherein the reducing gas includes hydrogen.

22. The method of claim 19, wherein the adhesion promoter layer is a first adhesion promoter layer, further comprising depositing a second adhesion promoter layer on low dielectric constant polymer layer before heating under the reducing gas.

23. The method of claim 22, further comprising exposing the second adhesion promoter layer to free radical generating energy after depositing the second adhesion promoter layer.

24. The method of claim 23, wherein the free radical generating energy is UV light.

25. The method of claim 19, wherein the silane material is selected from materials having a general formula of $(RZ)_x$—Si—$(W$—$T)_y$, wherein W is selected from the group consisting of —O—, —$CH_2$—, —$(CH_2)_a$C=OO—, and —$(CH_2)_a$—OO=C—; wherein T is selected from the group consisting of —CR=CR'R", an alkyl halide, and —RC=O; wherein Z is selected from the group consisting of O and NR, wherein R, R' and R" are an H, alkyl or aromatic group; wherein a is 0 or an integer; wherein x=1, 2 or 3; wherein y=1, 2 or 3; and wherein x+y=4.

26. The method of claim 19, wherein the low dielectric constant polymer layer is formed from a polymer material having a dielectric constant of less than 2.6.

27. The method of claim 26, wherein the low dielectric constant polymer layer is formed from a poly(paraxylylene) having a general formula of —(—C($F_x H_{2-x}$)—($C_6 F_y H_{4-y}$)—C($F_x H_{2-x}$)—)—, wherein x=0, 1 or 2, and wherein y=0, 1, 2, 3 or 4.

28. The method of claim 27, wherein the low dielectric constant polymer layer is formed from a poly(paraxylylene)-based material having a general structure of —($CF_2$—($C_6 H_4$)—$CF_2$)—, and wherein the low dielectric constant polymer layer is deposited with an initial crystallinity of at least 20% in a $\beta_2$ phase of the material.

29. The method of claim 19, wherein the low dielectric constant polymer layer is formed from a monomer having a general formula of $X'_m$—Ar—$(CZ'Z''Y')_n$, wherein Ar is an aromatic group or a fluorine-substituted aromatic group, wherein Z' and Z" are selected from the group consisting of H, F and $C_6 H_5$, wherein X' and Y' are leaving groups removable to generate free radicals, wherein m and n are each equal to zero or an integer, and wherein m+n is less than or equal to a total number of $sp^2$ hybridized carbons on Ar available for substitution.

30. The method of claim 19, further comprising exposing the substrate to ultraviolet radiation before depositing the silane material onto the substrate to remove water from a surface of the substrate.

31. The method of claim 19, wherein heating the adhesion promoter layer and the low dielectric constant polymer layer in the presence of the reducing gas includes heating the adhesion promoter layer and the low dielectric constant polymer layer under a mixture of 3–10% hydrogen in an inert gas.

32. The method of claim 19, wherein the adhesion promoter layer and the low dielectric constant polymer layer are heated under the reducing gas for 0.5–10 minutes.

33. The method of claim 19, wherein the adhesion promoter layer and the low dielectric constant polymer layer are heated under the reducing gas for 3–4 minutes.

34. The method of claim 19, wherein the adhesion promoter layer and the low dielectric constant polymer layer are heated under the reducing gas to a temperature of 300–400 degrees Celsius.

35. The method of claim 19, wherein the adhesion promoter layer and the low dielectric constant polymer layer are heated under the reducing gas to a temperature of 350–400 degrees Celsius.

36. A method of making an integrated circuit, the integrated circuit including a polymer dielectric layer disposed on an underlying silicon-containing layer, comprising:
exposing the silicon-containing layer to UV radiation;
depositing the polymer dielectric layer on the silicon-containing layer after exposing the silicon-containing layer to UV radiation by exposing the substrate to a concentration of a gas-phase free radical; and
heating the polymer dielectric layer in a presence of hydrogen, wherein heating the polymer dielectric layer in the presence of hydrogen caps unreacted free radicals with hydrogen.

37. The method of claim 36, wherein the gas-phase free radical is a diradical having a diradical monomer having a general formula of Ar—$(CZ'Z''*)_2$, wherein Ar is an aromatic group or a fluorine-substituted aromatic group.

38. The method of claim 36, wherein the polymer dielectric layer has a dielectric constant of less than 2.6.

39. The method of claim 36, further comprising depositing an adhesion promoter layer over the polymer dielectric layer, wherein the adhesion promoter layer is formed at least partially from a silane material selected from materials having a general formula of $(RZ)_x$—Si—$(W$—$T)_y$, wherein W is selected from the group consisting of —O—, —$CH_2$—, —$(CH_2)_a$C=OO—, and —$(CH_2)_a$—OO=C—; wherein T is selected from the group consisting of —CR=CR'R", an alkyl halide, and —RC=O; wherein Z is selected from the group consisting of O and NR, wherein R, R' and R" are an H, alkyl or aromatic group; wherein a is 0 or an integer; wherein x=1, 2 or 3; wherein y=1, 2 or 3; and wherein x+y=4.

40. The method of claim 39, further comprising exposing the adhesion promoter layer to a free radical generating energy source to generate free radicals from vinyl groups in the adhesion promoter layer to chemically bond with unreacted free radicals in the adhesion promoter layer before heating in the presence of hydrogen.

41. The method of claim 40, wherein the free radical generating energy source is a UV light source.

42. The method of claim 40, wherein the free radical generating energy source is a thermal energy source.

43. The method of claim 36, further comprising depositing an adhesion promoter layer on the silicon-containing layer before depositing the polymer dielectric layer.

* * * * *